United States Patent
Liang et al.

(10) Patent No.: US 10,629,539 B2
(45) Date of Patent: Apr. 21, 2020

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Fang-Yu Liang, Taipei (TW); Kai-Chiang Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/841,331

(22) Filed: Dec. 14, 2017

(65) Prior Publication Data

US 2019/0139897 A1     May 9, 2019

Related U.S. Application Data

(60) Provisional application No. 62/582,330, filed on Nov. 7, 2017.

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3114* (2013.01); *H01L 23/5383* (2013.01); *H01L 23/5384* (2013.01); *H01L 23/5386* (2013.01); *H01L 23/66* (2013.01); *H01L 24/19* (2013.01); *H01L 24/20* (2013.01); *H01L 24/29* (2013.01);
(Continued)

(58) Field of Classification Search
CPC ............ H01L 23/5389; H01L 23/5383; H01L 23/3114; H01L 2223/6677; H01Q 1/2283
See application file for complete search history.

(56) References Cited

U.S. PATENT DOCUMENTS 9,000,584 B2   4/2015   Lin et al.
9,048,222 B2   6/2015   Hung et al.
(Continued)

*Primary Examiner* — Jay C Chang
*Assistant Examiner* — Mikka Liu
(74) *Attorney, Agent, or Firm* — JCIPRNET

(57) ABSTRACT

A package structure including a semiconductor die, a redistribution layer, a plurality of antenna patterns, a die attach film, and an insulating encapsulant is provided. The semiconductor die have an active surface and a backside surface opposite to the active surface. The redistribution layer is located on the active surface of the semiconductor die and electrically connected to the semiconductor die. The antenna patterns are located over the backside surface of the semiconductor die. The die attach film is located in between the semiconductor die and the antenna patterns, wherein the die attach film includes a plurality of fillers, and an average height of the die attach film is substantially equal to an average diameter of the plurality of fillers. The insulating encapsulant is located in between the redistribution layer and the antenna patterns, wherein the insulating encapsulant encapsulates the semiconductor die and the die attach film.

19 Claims, 12 Drawing Sheets

(51) Int. Cl.
- *H01L 21/48* (2006.01)
- *H01L 21/56* (2006.01)
- *H01L 23/00* (2006.01)
- *H01L 21/683* (2006.01)
- *H01Q 1/22* (2006.01)
- *H01L 23/66* (2006.01)
- *H01Q 9/18* (2006.01)
- *H01Q 21/28* (2006.01)
- *H01Q 21/00* (2006.01)
- *H01Q 25/00* (2006.01)
- *H01Q 21/06* (2006.01)

(52) U.S. Cl.
CPC ............ *H01Q 1/2283* (2013.01); *H01Q 9/18* (2013.01); *H01Q 21/0087* (2013.01); *H01Q 21/065* (2013.01); *H01Q 21/28* (2013.01); *H01Q 25/00* (2013.01); *H01L 23/3128* (2013.01); *H01L 2221/68345* (2013.01); *H01L 2221/68359* (2013.01); *H01L 2221/68372* (2013.01); *H01L 2221/68386* (2013.01); *H01L 2223/6677* (2013.01); *H01L 2224/04105* (2013.01); *H01L 2224/12105* (2013.01); *H01L 2224/214* (2013.01); *H01L 2224/73267* (2013.01); *H01L 2224/83191* (2013.01); *H01L 2224/92244* (2013.01); *H01L 2224/97* (2013.01); *H01L 2924/19011* (2013.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2005/0248019 A1* | 11/2005 | Chao ............ H01L 25/0657 257/686 |
| 2014/0252646 A1* | 9/2014 | Hung ............ H01L 23/481 257/774 |
| 2016/0148857 A1* | 5/2016 | Lin ............ H01L 23/49811 257/762 |

* cited by examiner

PACKAGE STRUCTURE AND METHOD OF FABRICATING THE SAME

CROSS-REFERENCE TO RELATED APPLICATION 7285

This application claims the priority benefit of U.S. provisional application Ser. No. 62/582,330, filed on Nov. 7, 2017. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
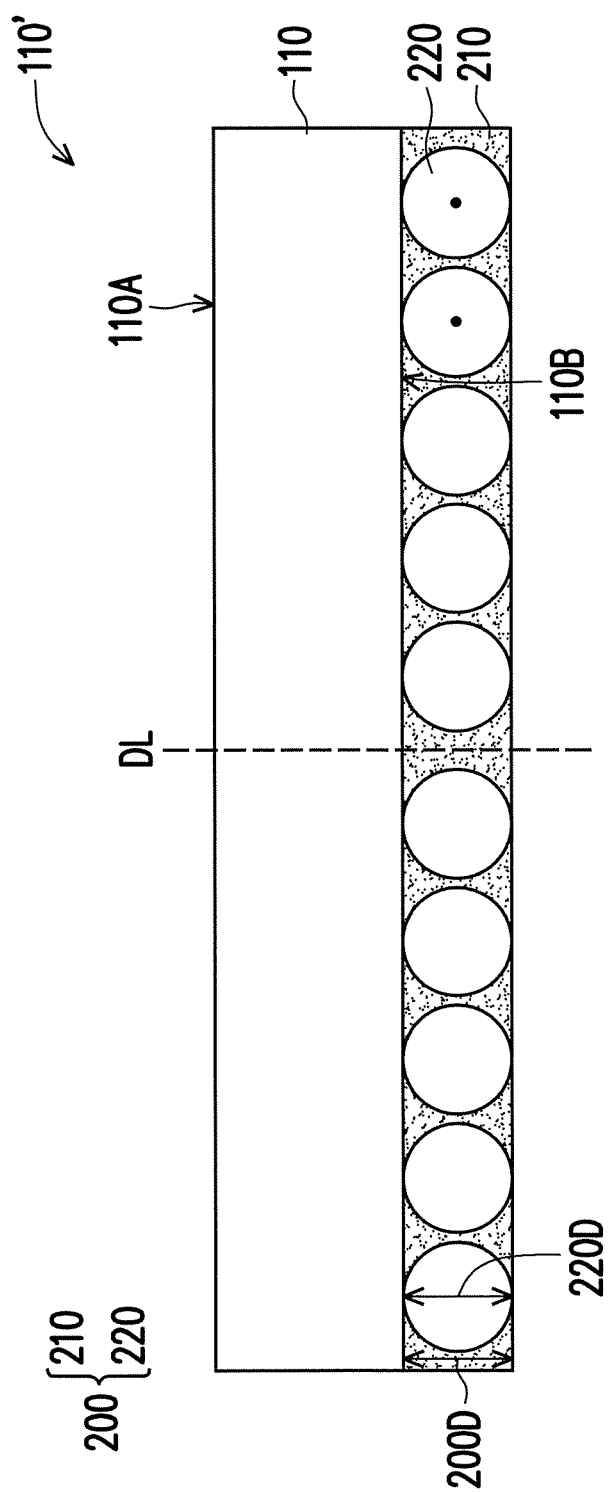
FIG. 1A to FIG. 10 are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 10 are schematic sectional views of various stages in a method of fabricating a package structure according to some exemplary embodiments of the present disclosure. As shown in FIG. 1A and FIG. 1B, a semiconductor wafer 110 including a plurality of semiconductor dies (not shown) is provided. In some embodiments, the semiconductor wafer 110 is a silicon bulk wafer. In some embodiments, the semiconductor wafer 110 is a reconstituted wafer. The semiconductor wafer 110 may further include active components, passive components, conductive elements or doped regions therein, but for illustration purposes, these components or elements are omitted in the figures. The semiconductor wafer 110 has an active surface 110A, and a backside surface 110B opposite to the active surface 110A. In some embodiments, a die attach film 200 is disposed on the backside surface 110B of the semiconductor wafer 110. In one embodiment, the semiconductor wafer 110 is backside thinned to a desirable thickness before disposing the die attach film 200. In some embodiments, the die attach film 200 comprises a plurality of fillers 220 dispersed within a film material 210. The film material 210, for example, may be a polymer-based glue material or a thermal-plastic resin material that can be hardened when heated or cured. The plurality of fillers 220 for example, may be inorganic particles, such as $Al_2O_3$ particles, metal oxide particles or the like. In some embodiments, the fillers 220 may be particles of spherical shapes.

Figure 1B:
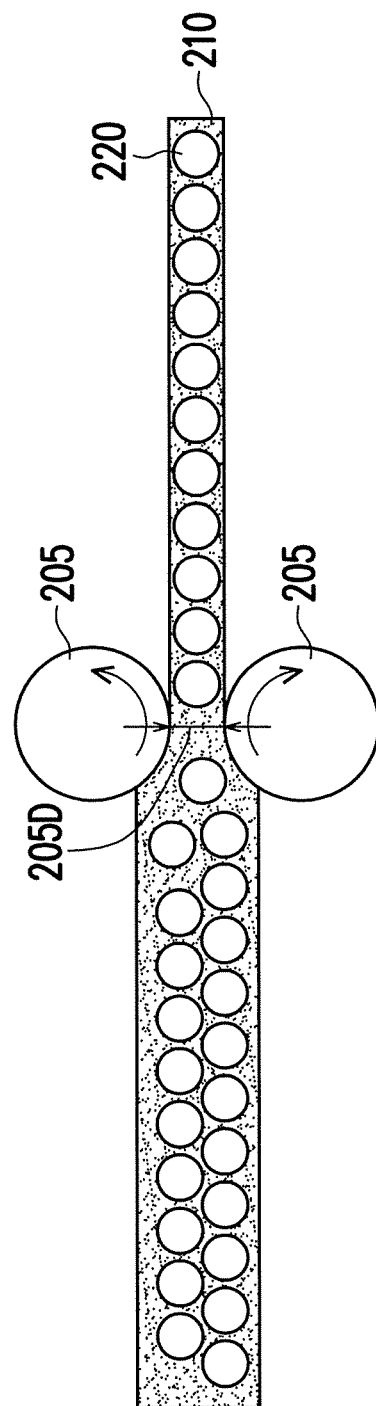

In the exemplary embodiments, the fillers 220 included in the die attach film 200 are arranged in a single layer. That is, the thickness of the die attach film 200 is principally decided by the largest dimension of the particles or the particle diameter of the fillers 220. In one embodiment, the fillers 220 included in the die attach film 200 are uniformly arranged beside one another as a monolayer layer. In some embodiments, the die attach film 200 is obtained through a press rolling process. For instance, as shown in FIG. 1B, the mixture including the film material 210 and the fillers 220 is pressed by the rollers 205 with a specific distance 205D apart. Through controlling the specific distance 205D to be slightly larger or about equivalent to the largest dimension of the particles or the particle diameter of the fillers 220, the press rolling process makes sure spreading out the fillers 220 evenly in the die attach film 200 of a specific thickness 200D so that the fillers 220 are dispersed in the film material 210 side-by-side as a monolayer, and the fillers 220 are not stacked on each other. In certain embodiments, the plurality of fillers 220 may have an average diameter 220D, and the fillers 220 are preferably particles of a substantially uniform size or diameter. In some embodiments, after the press rolling process, the average thickness (or the height) 200D of the die attach film 200 is substantially equal to the average diameter 220D of the plurality of fillers 220. In some embodiments, the diameter 220D of the plurality of fillers 220 is at least larger than 100 µm. In some embodiments, the diameter 220D of the plurality of fillers 220 is in a range from 100 µm 150 µm. In some embodiments, the content of the plurality of fillers 220 in the die attach film 200 is in the range of 20% by volume to 40% by volume. In some embodiments, the average thickness 200D of the die attach film 200 is in a range from 100 µm to 150 µm.

Figure 2:
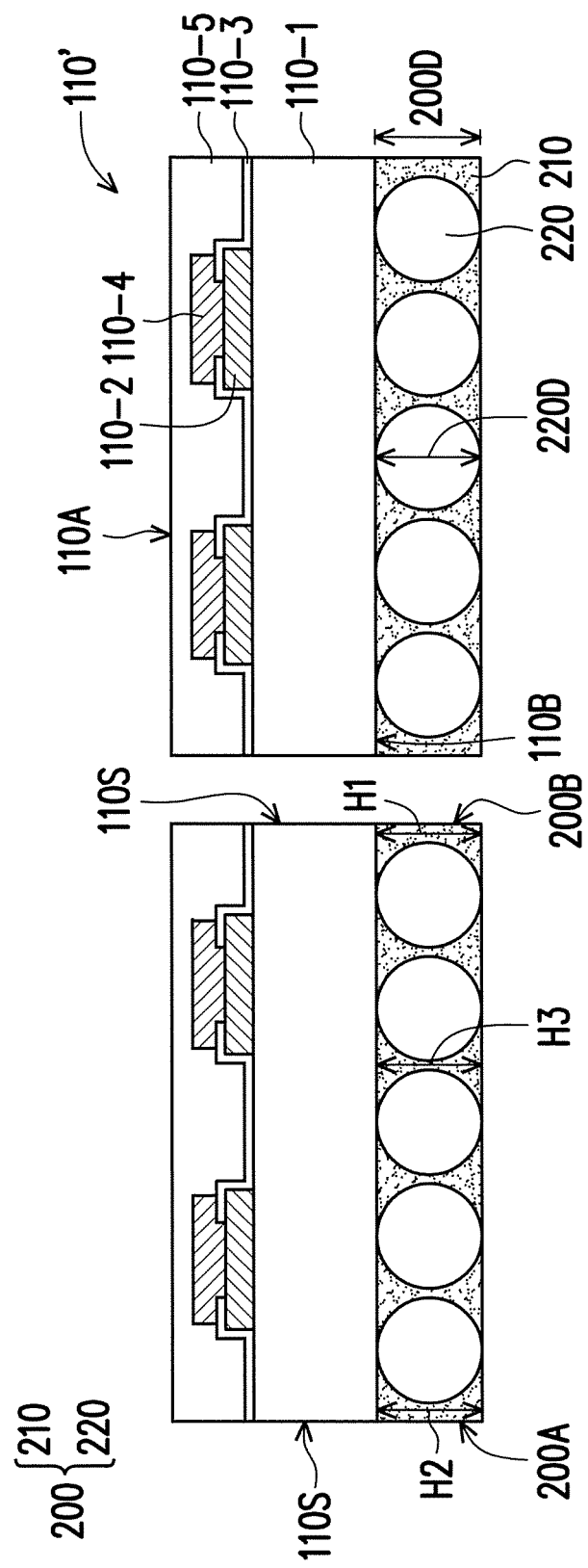

Next, referring to FIG. 2, semiconductor dies 110' are provided and each semiconductor die 100' has a die attach film 200 attached to its backside 110B. In some embodiments, the semiconductor dies 110' may be obtained by performing a wafer dicing process to the semiconductor wafer 110 and the die attach film 200 as depicted in FIG. 1A and FIG. 1B, such that the semiconductor wafer 110 is singulated into a plurality of semiconductor dies 110' (along with the diced die attach film 200 thereon). In certain embodiments, the wafer dicing process is performed at the dicing line(s) DL as shown in FIG. 1A to separate the semiconductor dies 110'. In certain embodiments, as shown in FIG. 2, each of the semiconductor die 110' includes a semiconductor substrate 110-1, a plurality of conductive pads 110-2 formed on the semiconductor substrate 110-1, and a passivation layer 110-3. In one embodiment, the passivation layer 110-3 is formed over the substrate 110-1 and has a plurality of opening so as to partially expose the conductive pads 110-2. In some embodiments, the semiconductor substrate 110-1 is a silicon substrate including active components (e.g., transistors, diodes, optoelectronic devices or the like) and passive components (e.g., resistors, capacitors, inductors, transducers or the like) formed therein. In certain embodiments, the conductive pads 110-2 are aluminum pads, copper pads or other suitable metallic pads. In some embodiments, the passivation layer 110-3 includes a silicon oxide layer, a silicon nitride layer, a silicon oxynitride layer or a dielectric layer formed by other suitable dielectric materials.

Furthermore, in some embodiments, conductive pillars 110-4 are formed on the exposed conductive pads 110-2 of the semiconductor die 110', and a protection layer 110-5 is formed on the passivation layer 110-3 but exposes the conductive pillars 110-4. In some embodiments, the conductive pillars 110-4 are copper pillars or copper alloy pillars. In certain embodiments, the protection layer 110-5 includes a polymer layer having sufficient thickness to protect the conductive pillars 110-4. For example, the protection layer 110-5 includes a polybenzoxazole (PBO) layer, a polyimide (PI) layer or layers of other suitable polymer materials. In some alternative embodiments, the protection layer 110-5 may be made of inorganic materials.

In the exemplary embodiment, as shown in FIG. 2, the die attach film 200 attached to each of the semiconductor dies 110' for example, includes a first side surface 200A and a second side surface 200B opposite to the first side surface 200A, and the first side surface 200A and the second side surface 200B of the die attach film 200 are respectively aligned with the two opposite side surfaces 110S of the semiconductor die 110'. In certain embodiments, the die attach film 200 at the first side surface 200A has a first height H1, and the die attach film 200 at the second side surface 200B has a second height H2. In some embodiments, compared with an average height H3 of the die attach film 200, a height variation between the first height H1, the second height H2 and the average height H3 of the die attach film 200 is within 10 µm. In certain embodiments, the height variation between the first height H1, the second height H2 and the average height H3 of the die attach film 200 is within 2.5 µm. Alternatively, the height variation between the first height H1, the second height H2 and the average height H3 is very small or nearly zero. In some embodiments, the die attach film 200 has a substantially uniform height or thickness over the whole area of the semiconductor die 100'.

In the exemplary embodiment, since the plurality of fillers 220 is uniformly arranged in a single layer in the die attach film 200, and that the diameter 220D of the plurality of fillers 220 is substantially equal to the height 200D of the die attach film 200, the height variation in each portion of the die attach film 200 may be controlled within 10 µm. In other words, the height 200D of the die attach film 200 may be defined and controlled through the plurality of fillers 220. Therefore, a height variation of the semiconductor die 110' formed on the die attach film 200 may also be minimized. In other embodiments, when fillers 220 are not used in the die attach film 200, a height variation of the die attach film 200 will become more prominent with the increase in thickness of the die attach film 200, which may eventually affect the die height and process yield of the package.

Figure 3:
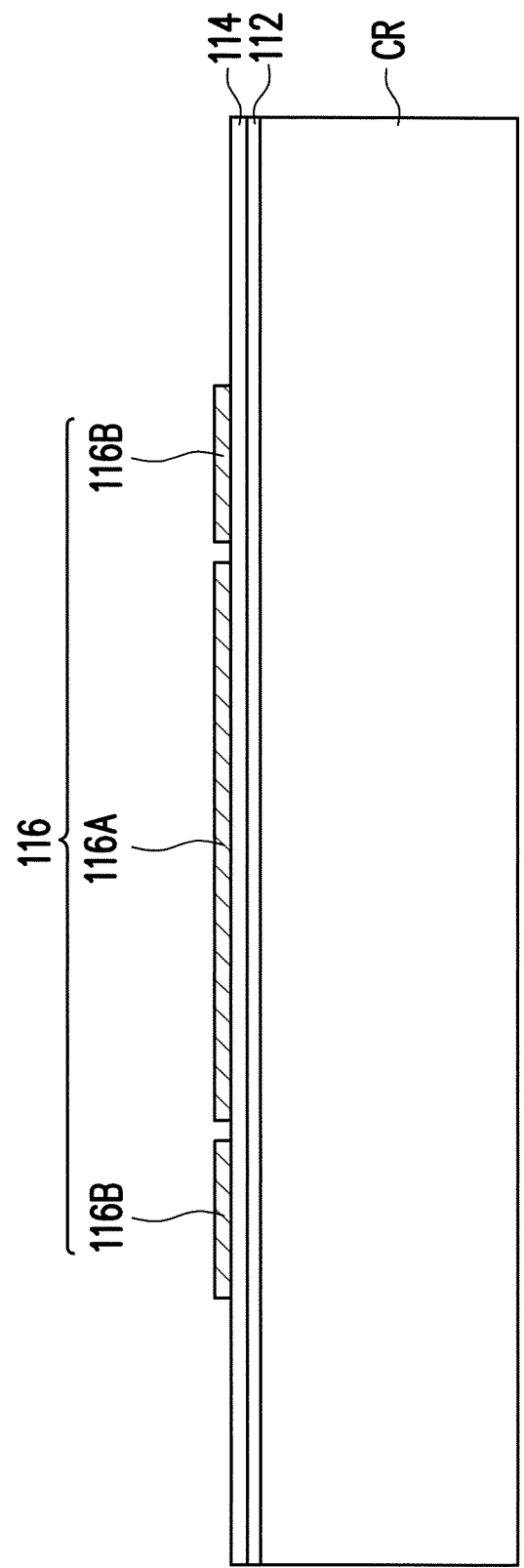

Next, as shown in FIG. 3, in some embodiments, a debond layer 112, a buffer layer 114 and a conductive pattern 116 are formed on a carrier CR. The carrier CR may be a glass carrier or any suitable carrier used in the method of fabricating the package structure. In some embodiments, the conductive pattern 116 is formed on the buffer layer 114, and includes a first portion 116A and a second portion 116B surrounding the first portion 116A. As shown in FIG. 1, the buffer layer 114 is located between the debond layer 112 and the conductive pattern 116, and the debond layer 112 is located between the carrier CR and the buffer layer 114. In certain embodiments, a portion of the buffer layer 114 is exposed by the conductive pattern 116. In some alternative embodiments, the buffer layer 114 may be omitted; in other words, merely the debond layer 112 is formed over the carrier CR. In some alternative embodiments, the conductive pattern 116 may be a single-layer structure without separate portions.

In the exemplary embodiment, the material of the debond layer 112 may be any material suitable for debonding the carrier CR from the above layers disposed thereon. In some embodiments, for example, the debond layer 112 may include a release layer (such as a light-to-heat conversion ("LTHC") layer) and an adhesive layer (such as an ultraviolet curable adhesive or a heat curable adhesive layer). In some embodiments, the buffer layer 114 may be a dielectric material layer. In some embodiments, the buffer layer 114 may be a polymer layer which is made of polyimide, polybenzoxazole (PBO), benzocyclobutene (BCB), or any other suitable polymer-based dielectric material. The debond layer 112 and the buffer layer 114 may be formed by a suitable fabrication technique such as spin-coating, lamination, deposition, or the like. In some embodiments, a material of the conductive pattern 116 for example, includes aluminum, titanium, copper, nickel, tungsten, and/or alloys thereof. In one embodiment, the conductive pattern 116 may be formed by a suitable fabrication technique such as plating process, photolithography and etching processes, or the like. In some embodiments, the patterning process includes performing a dry etching process, a wet etching process, or a combination thereof. In some embodiments, the conductive pattern 116 may serve as a ground plate for the later-formed antenna patterns.

Figure 4:
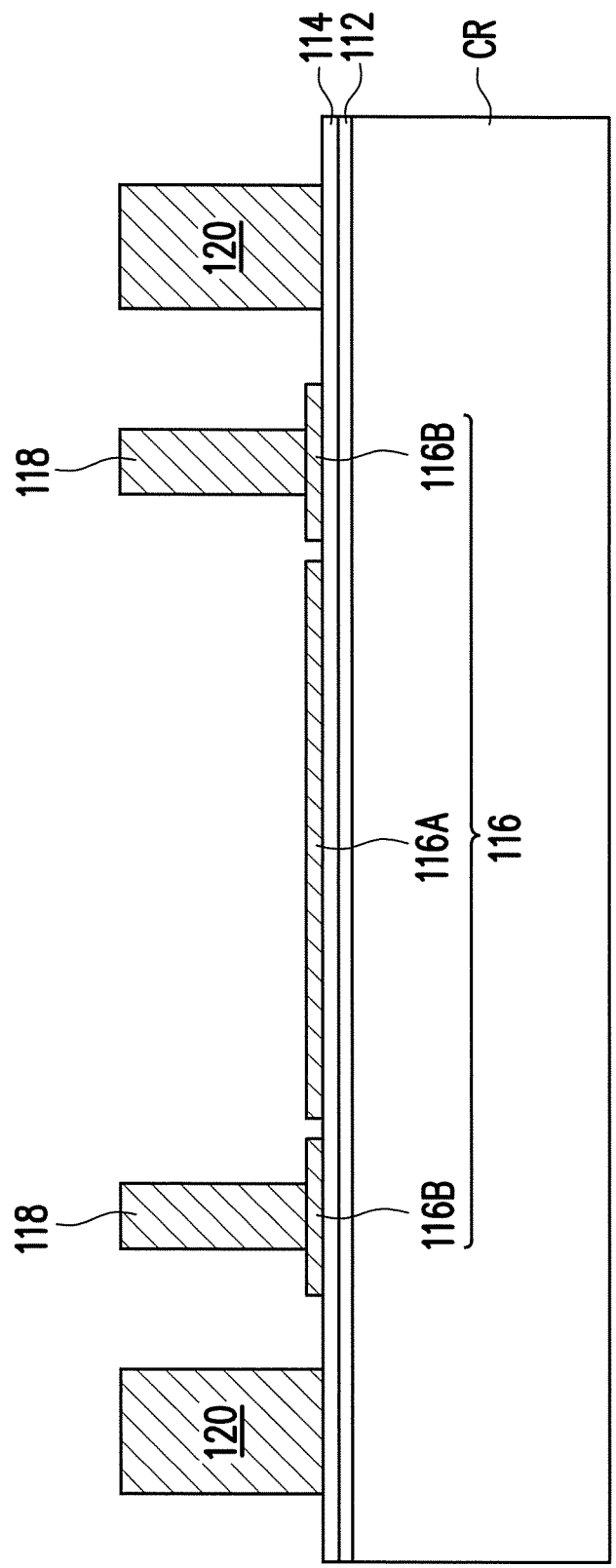

Referring to FIG. 4, after forming the conductive pattern 116, a plurality of through insulator vias 118 and antennas 120 are formed on the buffer layer 114. In some embodiments, the through insulator vias 118 and antennas 120 are formed by photolithography, plating, photoresist stripping processes or any other suitable methods. In one embodiment, the through insulator vias 118 may be formed by forming a mask pattern (not shown) covering the conductive pattern 116 and the buffer layer 114 with openings exposing a portion of the conductive pattern 116, then forming a metallic material filling the openings to form the through insulator vias 118 by electroplating or deposition and then removing the mask pattern. However, the disclosure is not limited thereto. In some embodiments, a material of the through insulator vias 118 may include a metal material such as copper or copper alloys, or the like. In some embodiments, the antennas 120 may be dipole antennas. In certain embodiments, the through insulator vias 118 are for example formed on the second portion 116B of the conductive pattern 116, while the antennas 120 are formed on the buffer layer 114 adjacent to the through insulator vias 118. For simplification, only two through insulator vias 118 and two antennas 120 are presented in FIG. 4 for illustrative purposes, however, it should be noted that more than two through insulator vias 118 and antennas 120 may be formed. In some embodiments, the number of the through insulator vias 118 and antennas 120 can be selected based on product demand.

Figure 5:
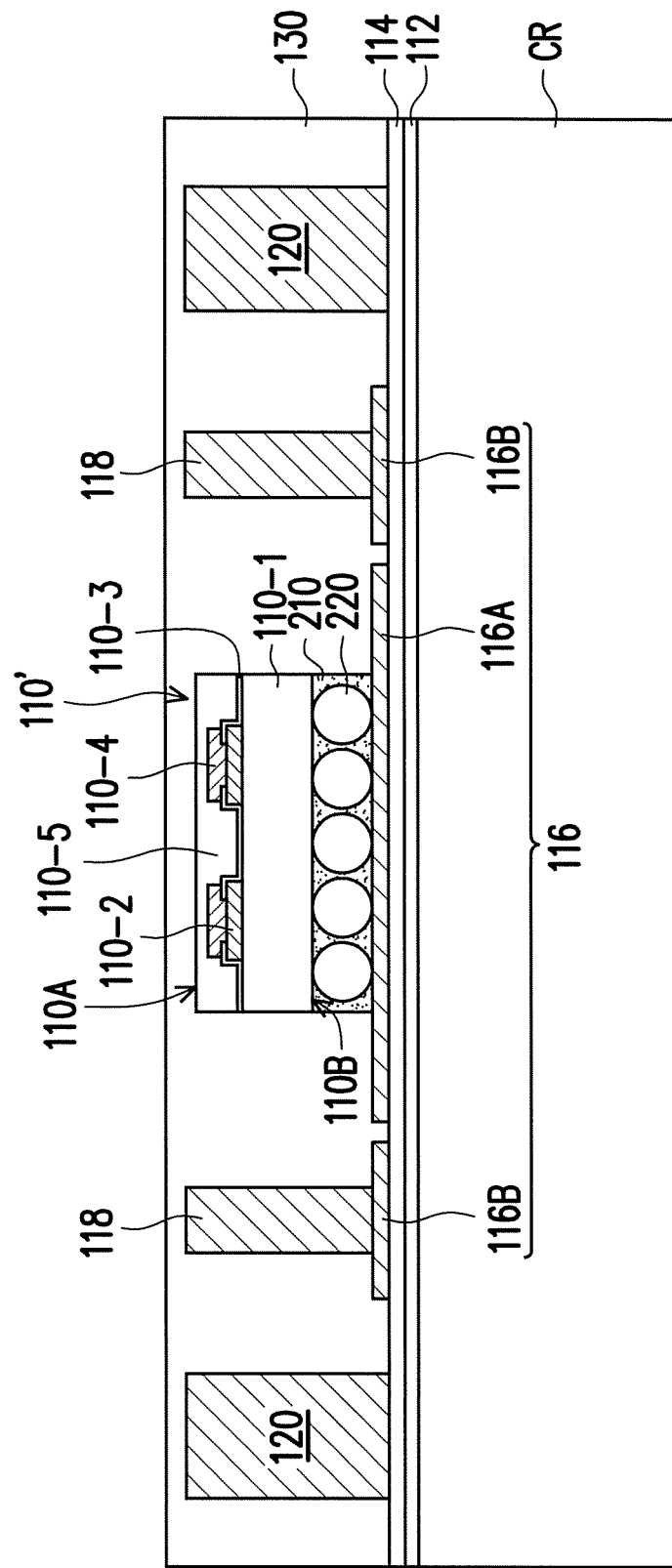

Referring to FIG. 5, after forming the through insulator vias 118 and antennas 120, the semiconductor die 110' may be picked and placed on the first portion 116A of the conductive pattern 116, and attached (or adhered) to the conductive pattern 116 through the die attach film 200. The semiconductor die 110' is for example surrounded by the through insulator vias 118. In addition, each of the fillers 220 in the die attach film 200 is in contact with the backside surface 110B of the semiconductor die 110' and in contact with the conductive pattern 116 (first portion 116A of conductive pattern 116). Although only one semiconductor die 110' is shown in FIG. 5, however, the number of semiconductor dies 110' are not limited thereto. In some alternative embodiments, more than one of the semiconductor die 110' may be picked and placed on the conductive pattern 116, wherein the semiconductor die 110' placed on the conductive pattern 116 may be arranged in an array. When the semiconductor dies 110' placed on the conductive pattern 116 are arranged in an array, the through insulator vias 118 may be classified into groups. The number of the semiconductor die 110' may correspond to the number of the groups of the through insulator vias 118. In the illustrated embodiment, one or more of the semiconductor die 110' is picked and placed on the conductive pattern 116 after the formation of the through insulator vias 118 and antennas 120. However, the disclosure is not limited thereto. In some alternative embodiments, one or more of the semiconductor die 110' may be picked and placed on the conductive pattern 116 before the formation of the through insulator vias 118 and antennas 120.

Furthermore, referring to FIG. 5, an insulating material 130 is formed on the buffer layer 114, the conductive pattern 116 and over the semiconductor die 110'. In some embodiments, the insulating material 106 is formed through, for example, a compression molding process, filling up the gaps between the semiconductor die 110', the die attach film 200, the through insulator vias 118 and the antennas 120. In certain embodiments, the insulating material 130 for example encapsulates the semiconductor die 110', the die attach film 200, the plurality of fillers 220, the conductive pattern 116, the through insulator vias 118 and the antennas 120. At this stage, the conductive pillars 110-4 and the protection layer 110-5 of the semiconductor die 110' are encapsulated and well protected by the insulating material 130. In other words, the conductive pillars 110-4 and the protection layer 110-5 of the semiconductor die 110' are not revealed and are well protected by the insulating material 130. In some embodiments, the insulating material 130 includes epoxy resins or other suitable resins. In some embodiments, the insulating material 130 has low permittivity (Dk) and low loss tangent (Df) properties. Depending on the frequency range of the high-speed applications, suitable materials of the insulating material 130 may be selected based on the required electrical properties of the package structure.

Figure 6:
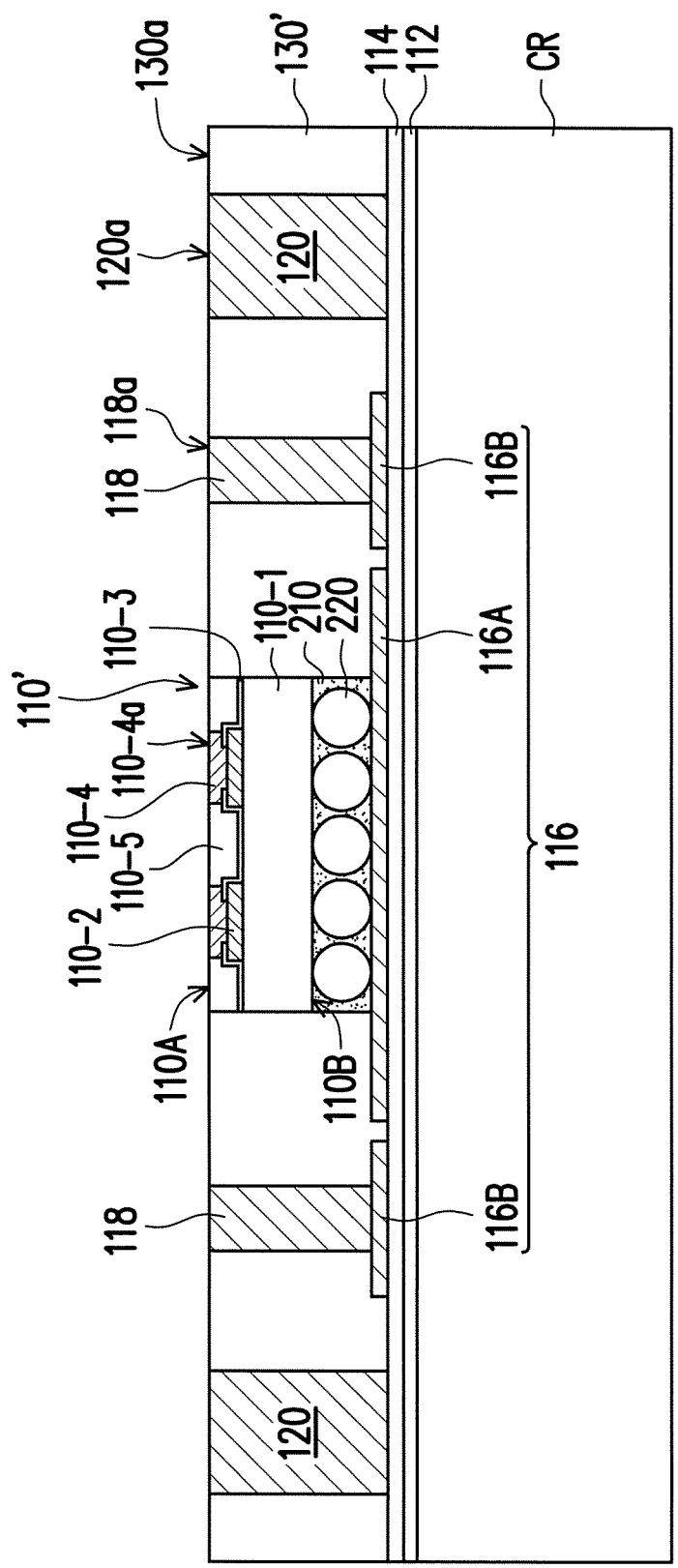

Referring to FIG. 6, in some embodiments, the insulating material 130 is partially removed to expose the conductive pillars 110-4 and the through insulator vias 118. In some embodiments, the insulating material 130 and the protection layer 110-5 are ground or polished by a mechanical grinding process, fly cutting process, and/or a chemical mechanical polishing (CMP) process to reveal the top surfaces 110-4a of the conductive pillars 110-4. In some embodiments, the through insulator vias 118 may be partially polished so that the top surfaces 118a of the through insulator vias 118 are levelled with the top surfaces 110-4a of the conductive pillars 110-4. The insulating material 130 is polished to form an insulating encapsulant 130'. In some embodiments, the top surface 130a of the insulating encapsulant 130', the top surfaces 118a of the through insulator vias 118, the top surfaces 120a of the antennas 120, and the active surface 110A of the semiconductor die 110' are substantially coplanar and levelled with one another. After the grinding or polishing steps, a cleaning step may be optionally performed, for example to clean and remove the residue generated from the grinding or polishing step.

Figure 7:
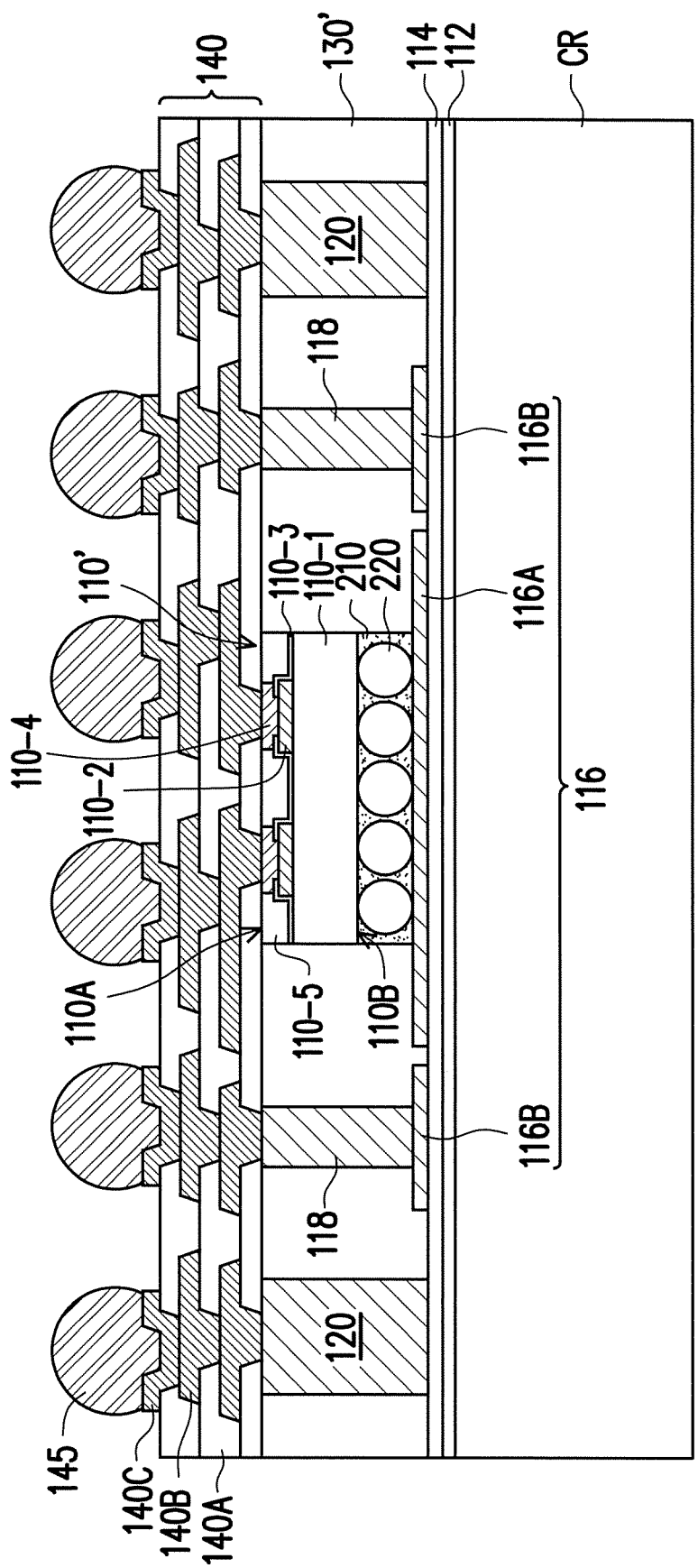

Referring to FIG. 7, in some embodiments, a redistribution layer 140 is formed on the semiconductor die 110', the through insulator vias 118, the antennas 120 and on the insulating encapsulant 130'. As shown in FIG. 7, the redistribution layer 140 is formed on the top surface 130a of the insulating encapsulant 130'. In some embodiments, the redistribution layer 150 is electrically connected to the second portion 116B of the conductive pattern 116 through the through insulator vias 118, and is electrically connected to the semiconductor die 110' through the conductive pillars 110-4. In some embodiments, as shown in FIG. 7, the semiconductor die 110' is located between the redistribution layer 140 and the die attach film 200. In certain embodiments, the insulating encapsulant 130 is located between the redistribution layer 140 and the buffer layer 114, and located between the redistribution layer 140 and the conductive pattern 116.

In some embodiments, the formation of the redistribution layer 140 includes sequentially forming one or more polymer dielectric layers 140A and one or more metallization layers 140B in alternation. In some embodiments, as shown in FIG. 7, the metallization layers 140B are sandwiched between the polymer dielectric layers 140A. In certain embodiments, the top surface of the topmost layer of the metallization layers 140B is exposed by the topmost layer of the polymer dielectric layers 140A and the lowest layer of the metallization layers 140B is exposed by the lowest layer of the polymer dielectric layers 152 to connect the through insulator vias 118 and the conductive pillars 110-4 of the semiconductor die 110'. In some embodiments, the material of the metallization layers 140B includes aluminum, titanium, copper, nickel, tungsten, and/or alloys thereof, and the metallization layers 140B may be formed by electroplating or deposition. In some embodiments, the material of the polymer dielectric layers 140A includes polyimide, epoxy resin, acrylic resin, phenol resin, benzocyclobutene (BCB), polybenzooxazole (PBO), or any other suitable polymer-based dielectric material. Although only two layers of the metallization layers 140B and three layers of polymer dielectric layers 140A are illustrated herein, however, the scope of the disclose is not limited by the embodiments of the disclosure.

After forming the polymer dielectric layers 140A and the metallization layers 140B, a plurality of under-ball metallurgy (UBM) patterns 140C is formed on the exposed top surface of the topmost layer of the metallization layers 140B for electrically connecting with conductive elements (e.g. conductive balls) and/or semiconductor elements (e.g., passive components or active components). In some embodiments, the material of the under-ball metallurgy patterns 140C, for example, may include copper, nickel, titanium, tungsten, or alloys thereof or the like, and may be formed by an electroplating process. Subsequently, in some embodiments, conductive elements 145 are formed on the redistribution layer 140. In one embodiment, the conductive elements 145 are formed on the redistribution layer 140 through the under-ball metallurgy patterns 140C. In some embodiments, some of the conductive elements 145 are electrically connected to the semiconductor die 110' through the under-ball metallurgy patterns 140C and the redistribution layer 140, and some of the conductive elements 145 are electrically connected to the conductive pattern 116 through the under-ball metallurgy patterns 140C, the redistribution layer 140, and the through insulator vias 118. In some embodiments, the conductive elements 145 are, for example, solder balls or ball grid array (BGA) balls. In some embodiments, the conductive elements 145 may be disposed on the under-ball metallurgy patterns 140C by a ball placement process or a reflow process.

Figure 8:
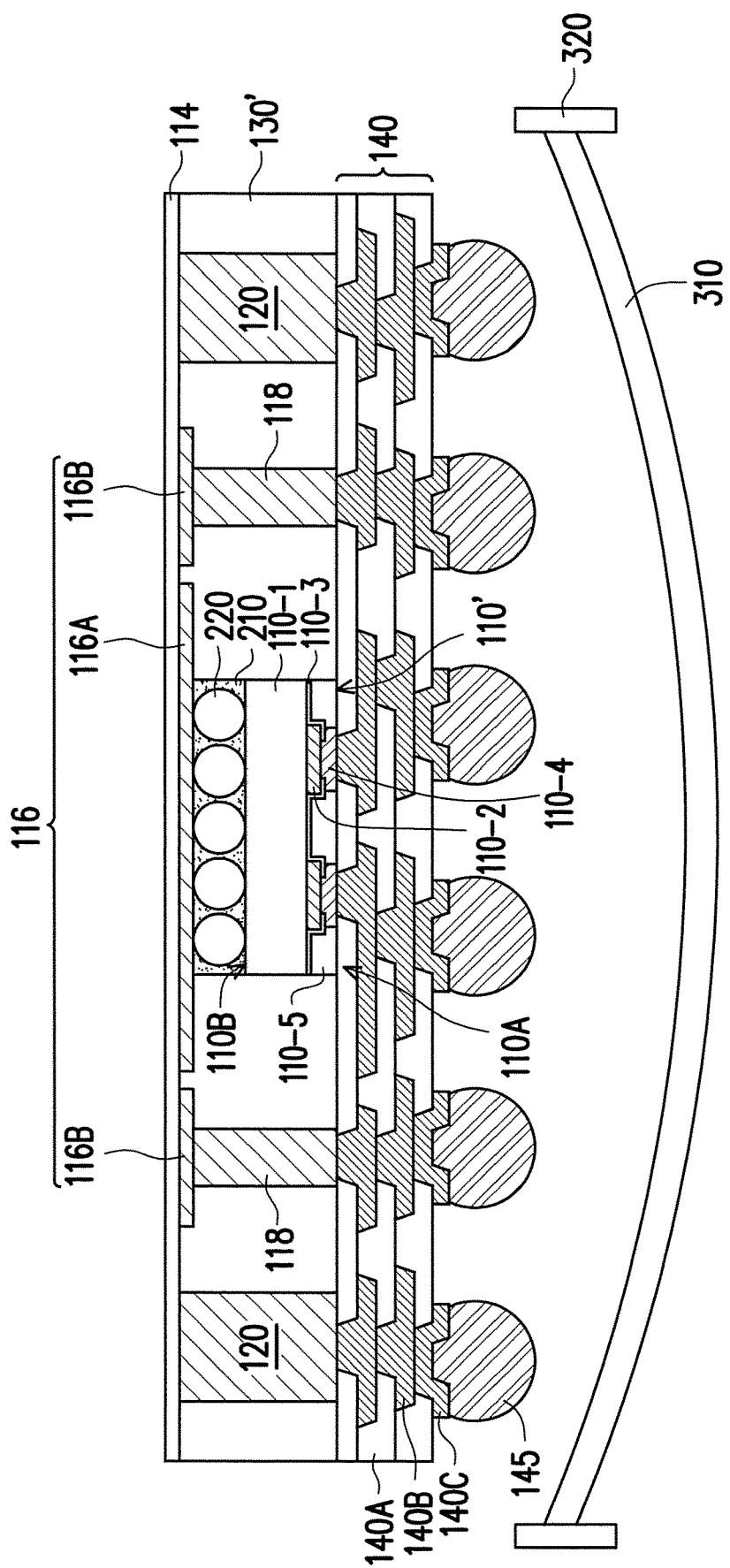

Referring to FIG. 8, after forming the redistribution layer 140 and the conductive elements 145, the structure shown in FIG. 7 is turned upside down and attached to a tape 310 (e.g., a dicing tape 310) supported by a frame 320. As illustrated in FIG. 8, the carrier CR is debonded and is separated from the semiconductor die 110' and the buffer layer 114. In accordance with some embodiments, the debonding process includes projecting a light such as a laser light or an UV light on the debond layer 112 so that the carrier CR can be easily removed along with the debond layer 112. In some embodiments, the buffer layer 114 may be peeled from the carrier CR by irradiating laser onto the debond layer 112 (e.g., the LTHC release layer). In alternative embodiments, the buffer layer 114 may be removed along with the debond layer 112 and the carrier CR, so that surfaces of the insulating encapsulant 130 and the conductive patterns 106 are exposed.

Figure 9A:
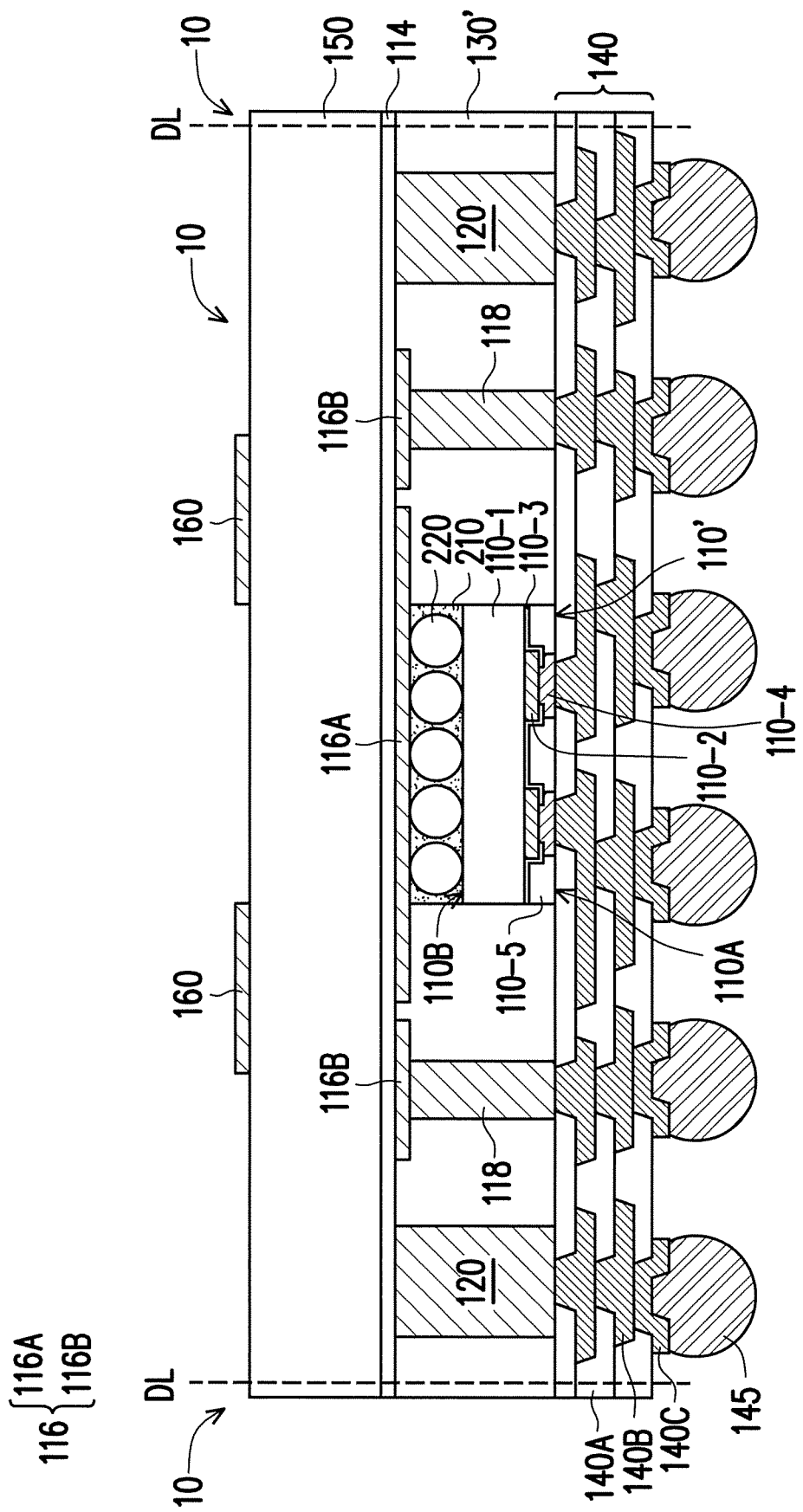
Figure 9B:
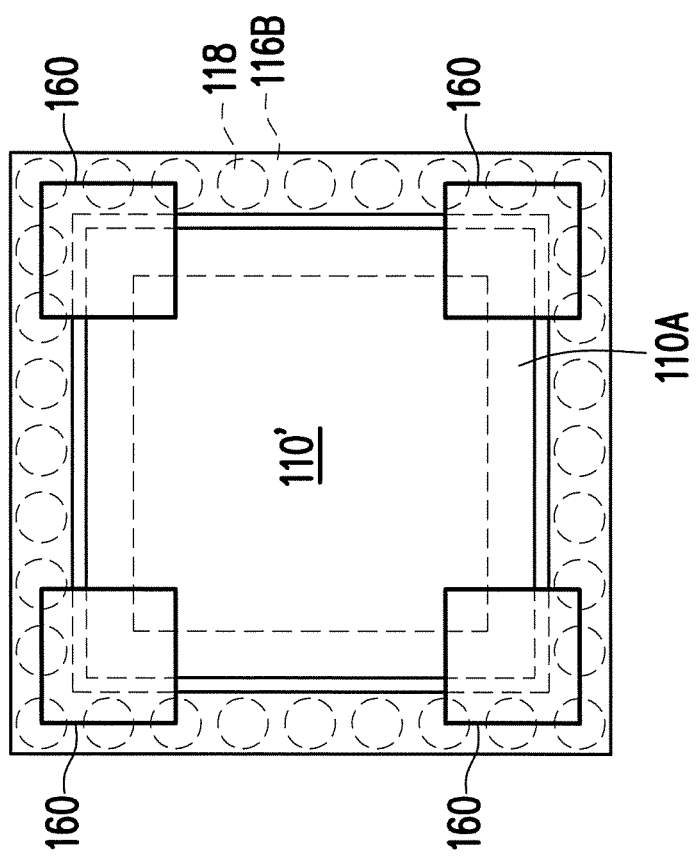

Referring to FIG. 9A, in some embodiments, after debonding the carrier CR, a molding compound 150 is formed on the buffer layer 114 and over the semiconductor die 110' and the conductive pattern 116. In some embodiments, the buffer layer 114 is sandwiched between the molding compound 150 and the insulating encapsulant 130'. In an alternative embodiment, prior to forming the molding compound 150, the buffer layer 114 may be optionally removed. In some embodiments, the molding compound 150 includes, for example, epoxy resins or any other suitable type of molding materials. In some embodiments, the material of the molding compound 150 has low permittivity (Dk) and low loss tangent (Df) properties. Depending on the frequency range of the high-speed applications, suitable materials of the encapsulant may be selected based on the required electrical properties of the package. In some embodiments, the material of the molding compound 150 can be the same as the material of the insulating encapsulant 130'. In an alternative embodiment, the material of the molding compound 150 can be different from the material of the insulating encapsulant 130', but the disclosure is not limited thereto.

Referring still to FIG. 9A, in some embodiments, a plurality of antenna patterns 160 are formed on the molding compound 150, and over the buffer layer 114. The molding compound 150 is for example located between the antenna patterns 160 and the buffer layer 114. As shown in FIG. 9A, the antenna patterns 160 are formed on a surface of the molding compound 150 opposite to a side where the buffer layer 114 is located. In some embodiments, the antenna patterns 160 are electrically coupled with the conductive patterns (first portion 116A), wherein the conductive patterns (first portion 116A) may serve as ground plates. In some embodiments, the antenna patterns 160 are formed by forming a metallization layer (not shown) by electroplating or deposition over the molding compound 150 and then patterning the metallization layer by photolithographic and etching processes. In an alternative embodiment, the antenna patterns 160 are formed by forming a metallization layer (not shown) by a plating process. In some embodiments, the antenna patterns 160 may include patch antennas, which are arranged in form of a matrix to surround the semiconductor die 110'. As more clearly shown from a top view of the structure presented in FIG. 9B, in some embodiments, the antenna patterns 160, for example, are arrange around the semiconductor die 110' and at locations near four corners of the semiconductor die 110' and partially overlapped with the corners of the semiconductor die 110' from the top view. However, the present disclosure is not limited thereto. In some other embodiments, the antenna patterns 160 may be fully overlapped with the semiconductor die 110' from the top view. In certain embodiments, the semiconductor die 110' are surrounded by the through insulator vias 118, while locations of the antenna patterns 160 partially overlap with the locations of the through insulator vias. However, the disclosure is not limited by the embodiments of the disclosure, and in alternative embodiments, the arrangement of the antenna patterns 160 may be adjusted based on product requirement.

Figure 10:
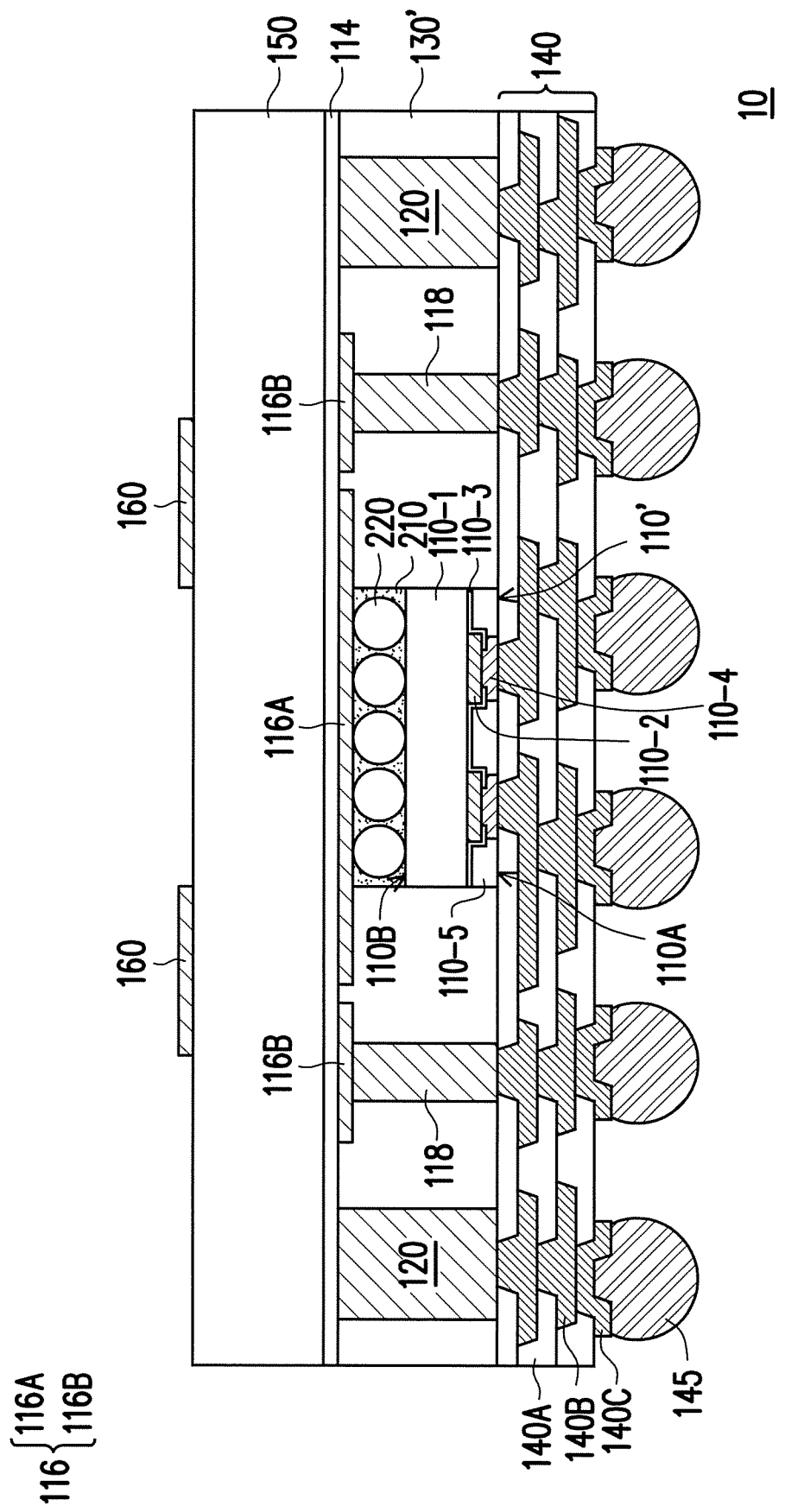

Referring to FIG. 10, after forming the antenna patterns 160, a dicing process is performed along the dicing lines DL (shown in FIG. 9A) to cut the whole wafer structure (cutting through the molding compound 150, the insulating encapsulant 130' and the redistribution layer 140) into a plurality of packages 10. In the exemplary embodiment, the dicing process is a wafer dicing process including mechanical blade sawing or laser cutting. In a subsequent process, the separated packages 10 may for example, be disposed onto a circuit substrate or onto other components based on requirements.

According to the above embodiments, the plurality of fillers is uniformly arranged as a monolayer in the die attach film, and the diameter of the plurality of fillers is substantially equal to the height of the die attach film. As such, a height variation between each portion of the die attach film may be reduced to a minimum, and the height of the semiconductor die formed thereon may be appropriately controlled. By having such configuration, the thick die attach film having aligned fillers may be used to increase a distance between the semiconductor die and the antenna patterns formed on the molding compound. As such, an interference to the performance of the antenna patterns can be reduced, and the process yield of the package may be improved.

In accordance with some embodiments of the disclosure, a package structure including a semiconductor die, a redistribution layer, a plurality of antenna patterns, a die attach film and an insulating encapsulant is provided. The semiconductor die have an active surface and a backside surface opposite to the active surface. The redistribution layer is located on the active surface of the semiconductor die and electrically connected to the semiconductor die. The plurality of antenna patterns is located over the backside surface of the semiconductor die. The die attach film is located in between the semiconductor die and the plurality of antenna patterns, wherein the die attach film includes a plurality of fillers, and an average height of the die attach film is substantially equal to an average diameter of the plurality of fillers. The insulating encapsulant is located in between the redistribution layer and the plurality of antenna patterns, wherein the insulating encapsulant encapsulates the semiconductor die and the die attach film.

In accordance with another embodiment of the disclosure, a package structure including a semiconductor die, a redistribution layer, a conductive pattern, a die attach film, a plurality of fillers, an insulating encapsulant and a plurality of antenna patterns is provided. The semiconductor die have an active surface and a backside surface opposite to the active surface. The redistribution layer is located on the active surface of the semiconductor die and electrically connected to the semiconductor die. The conductive pattern is located on the backside surface of the semiconductor die. The die attach film is located in between the semiconductor die and the conductive pattern, wherein the die attach film has a first side surface with a first height H1, a second side surface opposite to the first side surface with a second height H2, and an average height of the die attach film being H3, wherein a height variation between any two of the first height H1, the second height H2 and the average height H3 is within 10 µm. The plurality of fillers is dispersed in the die attach film, wherein the plurality of fillers is arranged as a monolayer within the die attach film. The insulating encapsulant is located in between the redistribution layer and the conductive pattern, wherein the insulating encapsulant encapsulates the semiconductor die and the die attach film. The plurality of antenna patterns is located on the backside surface of the semiconductor die and on the conductive pattern.

In accordance with yet another embodiment of the disclosure, a method of fabricating a package structure is described. The method comprises the following steps. A semiconductor die is provided having an active surface and a backside surface opposite to the active surface. A die attach film is formed on the backside surface of the semiconductor die, wherein the die attach film comprises a plurality of fillers therein and an average height of the die attach film is substantially equal to an average diameter of the plurality of fillers. A conductive pattern is formed on a carrier. The semiconductor die is bonded on the conductive pattern through the die attach film. The insulating encapsulant is formed to encapsulate the semiconductor die and the die attach film. A redistribution layer is formed on the active surface of the semiconductor die and on the insulating encapsulant. The carrier is debonded. A plurality of antenna patterns is formed over the backside surface of the semiconductor die and over the conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die having an active surface and a backside surface opposite to the active surface;
   a redistribution layer located on the active surface of the semiconductor die and electrically connected to the semiconductor die;
   a plurality of antenna patterns located over the backside surface of the semiconductor die, wherein the plurality of antenna patterns are arranged around the semiconductor die and at locations near four corners of the semiconductor die, and partially overlapped with the four corners of the semiconductor die;
   a die attach film located in between the semiconductor die and the plurality of antenna patterns, wherein the die attach film comprises a plurality of fillers, and an average height of the die attach film is substantially equal to an average diameter of the plurality of fillers; and
   an insulating encapsulant located in between the redistribution layer and the plurality of antenna patterns, wherein the insulating encapsulant encapsulates the semiconductor die and the die attach film.

2. The package structure according to claim 1, further comprising:
   a conductive pattern located over the backside surface of the semiconductor die, wherein the die attach film is between the conductive pattern and the semiconductor die;
   a molding compound disposed over the conductive pattern, wherein the molding compound is between the conductive pattern and the plurality of antenna patterns.

3. The package structure according to claim 2, wherein the conductive pattern comprises a first portion and a second portion surrounding the first portion, the semiconductor die is located on the first portion of the conductive pattern, a plurality of through insulator vias is located on the second portion of the conductive pattern, and the plurality of antenna patterns partially overlap with the through insulator vias and the second portion of the conductive pattern.

4. The package structure according to claim 1, wherein the average diameter of the plurality of fillers ranges from 100 µm to 150 µm and the average height of the die attach film ranges from 100 µm to 150 µm.

5. The package structure according to claim 1, wherein a content of the plurality of fillers in the die attach film is in a range of 20% by volume to 40% by volume.

6. The package structure according to claim 1, wherein a height variation of side surfaces of the die attach film is less than 10 µm.

7. A package structure, comprising:
   a semiconductor die having an active surface and a backside surface opposite to the active surface;
   a redistribution layer located on the active surface of the semiconductor die and electrically connected to the semiconductor die;
   a conductive pattern comprising a first portion and a second portion, wherein the first portion is located on the backside surface of the semiconductor die and partially covered by the semiconductor die located thereon, and the second portion is surrounding the first portion;

through insulator vias located on the second portion;

a die attach film sandwiched in between the semiconductor die and the conductive pattern and in physical contact with the semiconductor die and the conductive pattern, wherein the die attach film has a first side surface with a first height H1, a second side surface opposite to the first side surface with a second height H2, and an average height of the die attach film being H3, wherein a height variation between any two of the first height H1, the second height H2 and the average height H3 is within 10 µm;

a plurality of fillers dispersed in the die attach film, wherein the plurality of fillers is arranged as a monolayer within the die attach film;

an insulating encapsulant located in between the redistribution layer and the conductive pattern, wherein the insulating encapsulant encapsulates the semiconductor die and the die attach film; and a plurality of antenna patterns located on the backside surface of the semiconductor die and on the conductive pattern, wherein the plurality of antenna patterns is partially overlapped with the through insulator vias and the semiconductor die.

8. The package structure according to claim 7, further comprising:

a molding compound in between the conductive pattern and the plurality of antenna patterns.

9. The package structure according to claim 7, wherein the plurality of fillers is in contact with the backside surface of the semiconductor die and in contact with the conductive pattern.

10. The package structure according to claim 7, wherein an average diameter of the plurality of fillers is substantially equal to the average height H3 of the die attach film.

11. The package structure according to claim 7, wherein an average diameter of the plurality of fillers ranges from 100 µm to 150 µm and the average height of the die attach film ranges from 100 µm to 150 µm.

12. The package structure according to claim 7, wherein a content of the plurality of fillers in the die attach film is in a range of 20% by volume to 40% by volume.

13. The package structure according to claim 7, wherein the plurality of antenna patterns is arranged around the semiconductor die and at locations near four corners of the semiconductor die, and partially overlapped with the four corners of the semiconductor die.

14. A method of fabricating a package structure, comprising:

providing a semiconductor die having an active surface and a backside surface opposite to the active surface;

forming a die attach film on the backside surface of the semiconductor die, wherein the die attach film comprises a plurality of fillers therein and an average height of the die attach film is substantially equal to an average diameter of the plurality of fillers;

forming a conductive pattern on a carrier;

bonding the semiconductor die on the conductive pattern through the die attach film;

forming an insulating encapsulant to encapsulate the semiconductor die and the die attach film;

forming a redistribution layer on the active surface of the semiconductor die and on the insulating encapsulant, the redistribution layer electrically connected to the semiconductor die;

debonding the carrier;

forming a plurality of antenna patterns over the backside surface of the semiconductor die and over the conductive pattern, wherein the plurality of antenna patterns are arranged around the semiconductor die and at locations near four corners of the semiconductor die, and partially overlapped with the four corners of the semiconductor die;

wherein the die attach film is located in between the semiconductor die and the plurality of antenna patterns; and wherein the insulating encapsulant is located in between the redistribution layer and the plurality of antenna patterns.

15. The method according to claim 14, further comprising:

forming a molding compound on the conductive pattern after debonding the carrier, wherein the plurality of antenna patterns is located on the molding compound.

16. The method according to claim 14, further comprising:

forming antennas on the carrier, wherein the insulating encapsulant further encapsulates the antennas.

17. The method according to claim 14, wherein the plurality of fillers is arranged as a monolayer within the die attach film.

18. The method according to claim 17, wherein the plurality of fillers arranged as a monolayer is formed through a press rolling process by using rollers to spread out the plurality of fillers in the die attach film.

19. The method according to claim 14, wherein a content of the plurality of fillers in the die attach film is in the range of 20% by volume to 40% by volume.

* * * * *